United States Patent
Inoue et al.

(10) Patent No.: US 10,519,370 B2
(45) Date of Patent: Dec. 31, 2019

(54) PHOSPHOR AND APPLICATION THEREFOR

(71) Applicant: Denka Company Limited, Chuo-ku, Tokyo (JP)

(72) Inventors: Saori Inoue, Omuta (JP); Tomohiro Nomiyama, Omuta (JP)

(73) Assignee: Denka Company Limited, Chuo-ku, Tokyo (JP)

( * ) Notice: Subject to any disclaimer, the term of this patent is extended or adjusted under 35 U.S.C. 154(b) by 0 days.

(21) Appl. No.: 15/537,123

(22) PCT Filed: Dec. 16, 2015

(86) PCT No.: PCT/JP2015/085274
§ 371 (c)(1),
(2) Date: Jun. 16, 2017

(87) PCT Pub. No.: WO2016/098830
PCT Pub. Date: Jun. 23, 2016

(65) Prior Publication Data
US 2018/0265781 A1 Sep. 20, 2018

(30) Foreign Application Priority Data

Dec. 16, 2014 (JP) .................................. 2014-253979

(51) Int. Cl.
*H01L 33/00* (2010.01)
*C09K 11/77* (2006.01)
*H01L 33/50* (2010.01)
*C09K 11/08* (2006.01)

(52) U.S. Cl.
CPC ...... *C09K 11/7734* (2013.01); *C09K 11/0883* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 2006/0017365 A1 | 1/2006 | Nagatomi et al. | |
| 2006/0033083 A1 | 2/2006 | Sakane et al. | |
| 2007/0007494 A1* | 1/2007 | Hirosaki | C01B 21/0602 252/301.4 R |
| 2008/0303409 A1 | 12/2008 | Hirosaki | |
| 2015/0042222 A1* | 2/2015 | Emoto | C09K 11/0883 313/503 |
| 2015/0179899 A1* | 6/2015 | Hirosaki | H01L 33/502 257/88 |

FOREIGN PATENT DOCUMENTS

| | | |
|---|---|---|
| CN | 102066522 A | 5/2011 |
| CN | 102399554 A | 4/2012 |
| CN | 102433122 A | 5/2012 |
| CN | 103201213 A | 7/2013 |
| JP | 2004-071726 A | 3/2004 |
| JP | 2006-8721 A | 1/2006 |
| JP | 2006-8862 A | 1/2006 |
| JP | 2006-008948 A | 1/2006 |
| JP | 2006-16413 A | 1/2006 |
| JP | 2006-63323 A | 3/2006 |
| WO | 2013/111411 A1 | 1/2013 |

OTHER PUBLICATIONS

Uheda, K., et al., "An Analysis of Crystal Structure of Ca-Deficient Oxonitridoaluminosilicate, $Ca_{0.88}Al_{0.91}Si_{1.09}N_{2.85}O_{0.15}$," Journal of the Ceramic Society of Japan 117 (1361):94-98, Jan. 2009.
International Search Report dated Feb. 9, 2016, issued in corresponding International Application No. PCT/JP2015/085274, filed Dec. 16, 2015, 2 pages.
International Preliminary Report on Patentability dated Jun. 20, 2017, issued in corresponding International Application No. PCT/JP2015/085274, filed Dec. 16, 2015, 6 pages.

* cited by examiner

*Primary Examiner* — Calvin Y Choi
(74) *Attorney, Agent, or Firm* — Christensen O'Connor Johnson Kindness PLLC

(57) ABSTRACT

An object of the present invention is to provide a red phosphor, a light emitting element using the phosphor, and a light emitting device using the light emitting element. A phosphor represented by the general formula: $Ca_{x+y}Eu_y SiAlN_3$ in which x+y is 1.0 or more and 1.1 or less, y is 0.004 or more and 0.012 or less, the phosphor being activated with Eu, and some of the Ca element(s) being substituted with the Eu element(s), wherein the phosphor has a lattice constant a of 0.9747 nm or more and 0.9770 nm or less, and a lattice constant c of 0.5050 nm or more and 0.5055 nm or less, and wherein the phosphor has a Ca content of 27.8% by mass or more and 28.8% by mass or less, a dissolved oxygen content in the phosphor of 0.3% by mass or more and 1.2% by mass or less, and an Eu content of 0.4% by mass or more and 1.2% by mass or less.

4 Claims, No Drawings

PHOSPHOR AND APPLICATION THEREFOR

TECHNICAL FIELD

The present invention relates to a phosphor emitting a red light, a light emitting element having the phosphor, and a light emitting device having the light emitting element.

BACKGROUND ART

Patent Document 1 discloses $CaAlSiN_3$ activated with $Eu^{2+}$, which is one of red phosphors.

CITATION LIST

Patent Literature

Patent Document 1: Japanese Patent Application Laid-open Publication No. 2004-071726A

SUMMARY OF INVENTION

Technical Problem

The present invention provides a red phosphor activated with $Eu^{2+}$, which has higher luminous efficiency, as well as a light emitting element and a light emitting device using the phosphor.

Solution to Problem

As a result of extensive studies of a composition of $CaAlSiN_3$ activated with $Eu^{2+}$, the present inventors have found that the above problems can be solved by a specific compositional range which is out of the stoichiometric composition of Ca:Al:Si:N=1:1:1:3, and have completed the present invention.

A phosphor represented by the general formula: $Ca_{x+y}Eu_ySiAlN_3$ in which x+y is 1.0 or more and 1.1 or less, y is 0.004 or more and 0.012 or less, the phosphor being activated with Eu, and some of the Ca element(s) being substituted with the Eu element(s), wherein the phosphor has a lattice constant a of 0.9747 nm or more and 0.9770 nm or less, and a lattice constant c of 0.5050 nm or more and 0.5055 nm or less, and wherein the phosphor has a Ca content of 27.8% by mass or more and 28.8% by mass or less, a dissolved oxygen content in the phosphor of 0.3% by mass or more and 1.2% by mass or less, and an Eu content of 0.4% by mass or more and 1.2% by mass or less.

Some of the Ca element(s) of the phosphor may preferably be substituted with one or more elements selected from the group consisting of Mg, Li, Y and lanthanoid series elements (excluding La, Ce and Eu).

In one aspect, the present invention may also provide a light emitting element comprising the phosphor and a light source configured to irradiate the phosphor with excitation light.

In one aspect, the present invention may also provide a light emitting device comprising the light emitting element.

Advantageous Effects of Invention

A phosphor according to an embodiment of the present invention can exhibit higher luminous efficiency by specifying the lattice constants and the contents of the compositional elements of the phosphor which is represented by the general formula: $Ca_{x+y}Eu_ySiAlN_3$ activated with Eu and in which some of the Ca element(s) are substituted with the Eu element(s).

A light emitting element according to an embodiment of the present invention can exhibit higher luminous efficiency because the light emitting element comprises the phosphor.

A light emitting device according to an embodiment of the present invention can exhibit higher luminous efficiency because the light emitting device comprises the light emitting element.

DESCRIPTION OF EMBODIMENTS

One embodiment of the present invention provides a phosphor represented by the general formula: $Ca_{x+y}Eu_ySiAlN_3$ in which x+y is 1.0 or more and 1.1 or less, y is 0.004 or more and 0.012 or less, the phosphor being activated with Eu, and some of the Ca element(s) being substituted with the Eu element(s), wherein the phosphor has a lattice constant a of 0.9747 nm or more and 0.9770 nm or less, and a lattice constant c of 0.5050 nm or more and 0.5055 nm or less, and wherein the phosphor has a Ca content of 27.8% by mass or more and 28.8% by mass or less, a dissolved oxygen content in the phosphor of 0.3% by mass or more and 1.2% by mass or less, and an Eu content of 0.4% by mass or more and 1.2% by mass or less.

The phosphor according to one embodiment of the present invention is presented by the general formula: $Ca_{x+y}Eu_ySiAlN_3$. The phosphor is formed by binding of $(Si,Al)-N_4$ tetrahedrons in which the Ca atoms are located in gaps. The composition can maintain electric neutrality by a combination of parameters of the Ca element occupancy rate, Si/Al ratio and N/O ratio. A representative phosphor similar to the general formula is $CaAlSiN_3$ in which the Ca site occupancy rate is 100%, Si/Al=1, and O/N=0. When a part of $Ca^{2+}$ of $CaAlSiN_3$ is substituted with $Eu^{2+}$ which will act as a luminescent center, the phosphor becomes a red phosphor. The red phosphor requires a fluorescence spectrum peak wavelength of 645 nm or more and 655 nm or less, for example when excited with monochromatic light having a peak wavelength of 455 nm.

In general formula possessed by the phosphor according to one embodiment of the present invention, x+y is 1.0 or more and 1.1 or less, and preferably 1.0 or more and 1.08 or less, and more preferably 1.0 or more and 1.05 or less. If x+y is lower than 1.0, the Ca content will become so low that the increase of Eu content cannot be promoted, resulting in a significant decrease in the fluorescence intensity. If x+y exceeds 1.1, it is difficult to maintain the $CaAlSiN_3$ crystal, and a large amount of a heterogeneous phase other than the target crystal is generated, resulting in a significant decrease in the fluorescence intensity.

In the general formula possessed by the phosphor according to one embodiment of the present invention, y is 0.004 or more and 0.012 or less, and preferably 0.004 or more and 0.011 or less, and more preferably 0.004 or more and 0.010 or less. If the Eu content is too low, the fluorescence intensity cannot be improved, and if the Eu content is too high, the fluorescence intensity tends to decrease due to concentration quenching of fluorescence generated by energy transfer between the Eu elements.

The lattice constant a of the phosphor is 0.9747 nm or more and 0.9770 nm or less, and the lattice constant c of the phosphor is 0.5050 nm or more and 0.5055 nm or less, for the following reasons. The lattice constants are measured by an X-ray diffraction method.

The skeleton structure of the CaAlSiN$_3$ crystal is formed by binding of (Si,Al)—N$_4$ tetrahedrons in which the Ca atoms are located in gaps. A part of Ca$^{2+}$ is substituted with Eu$^{2+}$ which will act as a luminescent center, thereby resulting in the red phosphor. The composition of the phosphor can maintain electric neutrality by the whole of parameters of the Ca and Sr element occupancy rate, Si/Al ratio and N/O ratio.

However, the CaAlSiN$_3$ has variations in the composition among their crystals, from a microscopic viewpoint, and forms heterogeneous phase by-products such as crystalline and amorphous substances, or oxide layers on grain boundaries and particle surfaces, from a macroscopic viewpoint. Therefore, the bulk value of the composition may not necessarily reflect the solid solution composition of the fluorescence-emitting CaAlSiN$_3$ crystal. For the same reason, the raw material composition of the CaAlSiN$_3$ may be different from the composition of the CaAlSiN$_3$ crystal actually obtained.

The CaAlSiN$_3$ crystal has an orthorhombic crystal system and space group of Cmc 21. Al and Si occupy the same site and form a (Al,Si)—N$_4$ tetrahedron with four N peaks. The (Al,Si)—N$_4$ tetrahedrons are linked to each other while repeating inversion via 3-coordinated N to form zigzag (Al,Si)—N$_4$ layers in the bc in-plane direction. The (Al,Si)—N$_4$ layers are laminated via 2-coordinated N in the a-axis direction. Ca occupies the voids formed in the gaps of the (Al,Si)—N$_4$ layers and as a result occupies the 5-coordinated sites surrounded by five N atoms. Therefore, specifying the lattice constants of the CaAlSiN$_3$ crystal allows its composition range to be strictly determined.

The present inventors have found that it is difficult to realize an excessive large lattice constant a of the CaAlSiN$_3$ due to the solid solubility limit of Ca, and if the lattice constant a is too small or the lattice constant c is too large or too small, the fluorescence intensity is drastically decreased. Specifically, they have found that the lattice constant a of 0.9747 nm or more and 0.9770 nm or less and the lattice constant c of 0.5050 nm or more and 0.5055 nm or less result in the higher fluorescent peak intensity.

The phosphor according to one embodiment of the present invention has the Ca content of 27.8% by mass or more and 28.8% by mass or less. If the Ca content is too low, the fluorescence intensity cannot be improved and the increase of the Eu content cannot be promoted. If the Ca content is too high, the balance of the composition cannot be maintained, thereby leading to generation of heterogeneous phases. The Ca content may preferably be 27.8% by mass or more and 28.7% by mass or less, and more preferably 27.9% by mass or more and 28.7% by mass or less.

The phosphor according to one embodiment of the present invention has the dissolved oxygen content in the phosphor of 0.3% by mass or more and 1.2% by mass or less. If the dissolved oxygen content in the phosphor is too low, crystal grains grow insufficiently in the producing steps so that the higher fluorescence intensity cannot be obtained. If the dissolved oxygen content in the phosphor is too high, the lattice constants are out of the specified range as described above. The dissolved oxygen content in the phosphor may preferably be 0.5% by mass or more and 1.0% by mass or less, and more preferably 0.7% by mass or more and 0.9% by mass or less.

The phosphor according to one embodiment of the present invention has the Eu content of 0.4% by mass or more and 1.2% by mass or less. If the Eu content is too low, the fluorescence intensity cannot be improved. If the Eu content is too high, the fluorescence intensity tends to decrease due to concentration quenching of fluorescence generated by energy transfer between the Eu elements. The Eu content may preferably be 0.4% by mass or more and 1.1% by mass or less, and more preferably 0.4% by mass or more and 1.0% by mass or less.

In the phosphor of one embodiment of the present invention, some of the Ca element(s) may preferably be substituted with one or more elements selected from the group consisting of Mg, Li, Y, and lanthanoids (excluding La, Ce, and Eu). This is effective to tune fluorescence characteristics for the purpose of maintaining charge balance.

In another aspect, the invention may provide a light emitting element comprising the phosphor and a light source irradiating the phosphor with excitation light.

In another aspect, the present invention may also provide a light emitting device comprising the light emitting element. The light emitting device may include lighting fixtures, lighting devices, image display devices, traffic lights, and projectors.

EXAMPLES

Examples of the present invention will be described while being compared with Comparative examples, with reference to Table 1.

TABLE 1

| | General Formula (Charged Value) | | Lattice Constant (nm) | | Ca Content | Dissolved Oxygen Content | Eu Content | Peak Wavelength | Relative Fluorescence Peak Intensity | General Formula (Actual Value) | |
|---|---|---|---|---|---|---|---|---|---|---|---|
| | x + y | y | a | c | (% by mass) | (% by mass) | (% by mass) | (nm) | (%) | x + y | y |
| Example 1 | 1.033 | 0.007 | 0.9761 | 0.5051 | 28.4 | 0.81 | 0.67 | 653 | 170.4 | 1.023 | 0.006 |
| Example 2 | 1.033 | 0.004 | 0.9755 | 0.5050 | 28.1 | 0.87 | 0.40 | 651 | 162.0 | 1.015 | 0.004 |
| Example 3 | 1.033 | 0.006 | 0.9755 | 0.5050 | 28.1 | 0.87 | 0.60 | 651 | 162.0 | 1.012 | 0.006 |
| Example 4 | 1.033 | 0.010 | 0.9768 | 0.5053 | 28.7 | 0.76 | 0.94 | 654 | 178.8 | 1.037 | 0.009 |
| Example 5 | 1.033 | 0.007 | 0.9761 | 0.5051 | 27.9 | 0.81 | 0.67 | 649 | 170.8 | 1.010 | 0.006 |
| Comparative Example 1 | 1.033 | 0.007 | 0.9746 | 0.5048 | 27.7 | 0.83 | 0.65 | 649 | 159.4 | 0.993 | 0.006 |
| Comparative Example 2 | 0.988 | 0.004 | 0.9739 | 0.5047 | 27.4 | 0.89 | 0.38 | 647 | 151.0 | 0.985 | 0.004 |
| Comparative Example 3 | 0.988 | 0.006 | 0.9739 | 0.5047 | 27.4 | 0.89 | 0.58 | 647 | 151.0 | 0.987 | 0.005 |
| Comparative Example 4 | 1.033 | 0.006 | 0.9737 | 0.6001 | 28.0 | 5.84 | 0.92 | 628 | 102.1 | 1.011 | 0.009 |
| Comparative Example 5 | 0.900 | 0.015 | 0.9746 | 0.5057 | 28.0 | 0.87 | 1.32 | 660 | 152.3 | 1.015 | 0.013 |

TABLE 1-continued

| | General Formula (Charged Value) | | Lattice Constant (nm) | | Ca Content | Dissolved Oxygen Content | Eu Content | Peak Wavelength | Relative Fluorescence Peak Intensity | General Formula (Actual Value) | |
|---|---|---|---|---|---|---|---|---|---|---|---|
| | x + y | y | a | c | (% by mass) | (% by mass) | (% by mass) | (nm) | (%) | x + y | y |
| Comparative Example 6 | 1.033 | 0.012 | 1.9505 | 1.0099 | 28.1 | 1.10 | 1.63 | 665 | 151.0 | 1.022 | 0.015 |

Table 1 shows values of x and y in the general formula (charged values and actual values), lattice constants (unit: nm), dissolved oxygen contents in the phosphor (unit: % by mass), Eu contents (unit: % by mass), Ca contents (unit: % by mass), peak wavelengths (unit: nm), and relative fluorescence peak intensity (unit:%) for the phosphors of Examples and Comparative Examples.

Each measurement method will be described.

<Lattice Constants a and c>

For the lattice constants of each phosphor, the crystal phase was identified by a powder X-ray diffraction analysis (XRD) with CuKα wavelength using an X-ray diffractometer (Ultima IV, available from Rigaku Corporation).

The crystal phase of the phosphor according to Example 1 was a CaAlSiN$_3$ single phase. Based on the resulting X-ray diffraction pattern, Reitveld analysis was carried out using an crystal structure analysis software (JADE, available from Rigaku Corporation) to refine the lattice constants. The lattice constant a of the phosphor according to Example 1 was 0.9761 nm and the lattice constant c was 0.5051 nm.

<Eu Content Rate and Ca Content>

The Eu content and the Ca content of each phosphor were measured using an oxygen/nitrogen analyzer (EMGA-920, available from Horiba, Ltd.). For the phosphor of Example 1, the Eu content was 0.67% by mass, and the Ca content was 28.4% by mass.

<Peak Wavelength>

For the peak wavelength of each phosphor, excitation/fluorescence spectrum of the phosphor was measured using a spectral fluorescence photometer (F7000, available from Hitachi High-Technologies Corporation). The excitation wavelength of the fluorescence spectrum was set to 455 nm and the monitored wavelength of the excitation spectrum was regarded as the peak wavelength of the fluorescence spectrum as excited at 455 nm.

<Relative Fluorescence Peak Intensity>

The unit of the relative fluorescence peak intensity is arbitrary because it varies depending on measuring apparatus and conditions, and the fluorescence peak intensity was evaluated by comparing Examples and Comparative Examples measured under the same conditions with each other. The passing threshold was 160% or more.

Example 1

The phosphor according to Example 1 is a phosphor represented by the general formula: Ca$_{x+y}$Eu$_y$SiAlN$_3$ in which x+y is 1.033, y is 0.007, the phosphor being activated with Eu, and some of the Ca element(s) being substituted with the Eu element(s), wherein the lattice constant a of the phosphor is 0.9761 nm, the lattice constant c of the phosphor is 0.5051 nm or more, the Ca content is 28.4% by mass, the dissolved oxygen content in the phosphor is 0.81% by mass, and the Eu content is 0.67% by mass.

Although the composition of the phosphor is different from the raw material mixing ratio in the production method as stated below, the difference is due to an influence of impurity oxygen and volatilization in the heat treatment step.

The phosphor according to Example 1 was the red phosphor with a peak wavelength of 653 nm and relative fluorescence peak intensity of 170.4%.

A method for producing the phosphor of Example 1 will be described. The phosphor was produced through a raw material mixing step, a firing step and an acid treatment step.

<Mixing Step>

The raw materials for the phosphor of Example 1 are 37.6% by mass of alpha-type silicon nitride powder (SN-E10 grade, the dissolved oxygen content in the phosphor of 1.0% by mass, available from UBE INDUSTRIES LTD.), 27.4% by mass of aluminum nitride powder (E grade, a dissolved oxygen content in the phosphor of 0.8% by mass, available from Tokuyama Corporation), 0.8% by mass of europium oxide (RU grade, available from Shin-Etsu Chemical Co., Ltd.), and 34.2% by mass of calcium nitride powder (purity of 99%, grain size of 75 μm or less, the dissolved oxygen content in the phosphor of 0.6% by mass, available from Materion Corporation).

In the mixing, the alpha-type silicon nitride powder, the aluminum nitride powder and the europium oxide were placed in a nylon pot and ball mill-blended using silicon nitride balls and ethanol as a solvent. The solvent was dried and removed, and the whole amount was then passed through a sieve having a mesh size of 75 μm.

The raw material mixture from which aggregates had been removed was placed in a glove box purged with nitrogen, and the calcium nitride powder which was the remaining material was manually mixed.

<Firing Step>

The raw material mixture after the mixing step was filled into a cylindrical-shaped boron nitride container with a lid (N-1 grade, available from Denka Company Limited.) in a glove box, then taken out from the glove box, and set in an electric furnace with carbon heaters. The furnace was sufficiently evacuated under vacuum to 0.1 Pa or less. In a state where the evacuation under vacuum was maintained, heating was started from room temperature. Nitrogen gas was introduced at 600° C., and a pressure of the atmosphere in the furnace was set to 0.1 MPa. After setting the pressure to 0.1 MPa, the temperature was raised to 1800° C., and once the temperature reached 1800° C., firing was carried out by maintaining this temperature for 4 hours.

After the firing for 4 hours, the inside of the electric furnace was cooled to room temperature. The fired product in the electric furnace was a red agglomerate. The red agglomerate was disintegrated in a mortar.

<Acid Treatment Step>

The fired powder was subjected to an acid treatment for 1 hour by mixing the powder with 1N hydrochloric acid solution so as to have a slurry concentration of 25% by mass, and a boiling treatment was then carried out for 1 hour while stirring the hydrochloric acid slurry.

After the acid treatment, the slurry was cooled to room temperature, and then filtered to separate the phosphor from the acid treatment solution. The phosphor was dried in a dryer at the temperature of 100° C. to 120° C. for 12 hours and passed through a sieve having a mesh size of 45 μm to obtain treated powder. The resulting powder is the phosphor according to Example 1.

Comparative Example 1

The phosphor of Comparative Example 1 was the same as that of Example 1, with the exception that the raw material mixing ratio was silicon nitride powder:aluminum nitride powder:europium oxide powder:calcium nitride powder=38.1:27.8:0.84:33.3% by mass.

As shown in Table 1, the phosphor of Comparative Example 1 had the peak wavelength of the fluorescence spectrum of 649 nm and the peak intensity of 159.4%, when excited with light having a wavelength of 455 nm. When compared with Example 1, the fluorescence peak wavelength was shifted to the shorter wavelength side and the fluorescence peak intensity was lower.

The phosphor of Comparative Example 1 corresponds to the conventional one, namely "phosphor which is represented by the general formula: $Ca_{x+y}Eu_ySiAlN_3$ and activated with Eu, and in which some of the Ca element(s) is substituted with the Eu element(s)".

Examples 2 to 4, Comparative Example 2 to 6

The raw material powders used in Example 1 and Comparative Example 1 were mixed at various mixing ratios and the mixed powders were treated in the same manner as in Example 1 to produce the phosphors of Examples 2 to 4 and Comparative Examples 2 to 6, and the phosphors were evaluated. In Comparative Example 2 having the lower Eu content and Comparative Example 3 having the lower Ca content, the relative fluorescence peak intensities was lower. In Comparative Example 4 having the higher dissolved oxygen content and Comparative Example 5 having the composition deviating from the general formula, the relative fluorescence peak intensities were lower and the lattice constants were out of the range of the present invention. In Comparative Example 6 having the higher Eu content, the peak wavelength was 665 nm, which was out of the range of the red phosphor.

Example 5

The phosphor of Example 5 had the structure where a part of Ca in the phosphor of Example 1 was substituted with Li.

The phosphor of Example 5 had the peak wavelength of 649 nm and the relative fluorescence peak intensity of 170.8%. The structure of phosphor according to Example 5 was effective for maintaining charge balance.

The invention claimed is:

1. A phosphor represented by the general formula: $Ca_{x+y}Eu_ySiAlN3$ in which x+y is 1.0 or more and 1.1 or less, y is 0.004 or more and 0.012 or less, the phosphor being activated with Eu, and some of the Ca element(s) being substituted with the Eu element(s),
   wherein the phosphor has a lattice constant a of 0.9747 nm or more and 0.9770 nm or less, and a lattice constant c of 0.5050 nm or more and 0.5055 nm or less, and
   wherein the phosphor has a Ca content of 27.8% by mass or more and 28.8% by mass or less, a dissolved oxygen content in the phosphor of 0.3% by mass or more and 1.2% by mass or less, and an Eu content of 0.4% by mass or more and 1.2% by mass or less.

2. The phosphor according to claim 1, wherein some of the Ca element(s) of the phosphor are substituted with one or more elements selected from the group consisting of Mg, Li, Y and lanthanoids (excluding La, Ce and Eu).

3. A light emitting element comprising the phosphor according to claim 1 and a light source configured to irradiate the phosphor with excitation light.

4. A light emitting device comprising the light emitting element according to claim 3.

* * * * *